United States Patent [19]

Shigenaka et al.

[11] Patent Number: 5,111,043
[45] Date of Patent: May 5, 1992

[54] APPARATUS FOR MATERIAL SURFACE OBSERVATION

[75] Inventors: Naoto Shigenaka; Tsuneyuki Hashimoto, both of Hitachi; Motomasa Fuse, Katsuta, all of Japan

[73] Assignee: Hitachi, Ltd., Tokyo, Japan

[21] Appl. No.: 639,129

[22] Filed: Jan. 9, 1991

[30] Foreign Application Priority Data

Jan. 10, 1990 [JP] Japan .................................. 2-1543

[51] Int. Cl.$^5$ .......................................... G01N 23/04
[52] U.S. Cl. .................... 250/306; 250/309; 250/310
[58] Field of Search ............ 250/306, 307, 305, 309, 250/310, 311

[56] References Cited

U.S. PATENT DOCUMENTS

| | | | |
|---|---|---|---|
| 3,974,390 | 8/1976 | Morita et al. | 250/306 |
| 4,031,388 | 6/1977 | Morita et al. | 250/306 |
| 4,052,614 | 10/1977 | Fletcher et al. | 250/306 |
| 4,453,086 | 6/1984 | Grobman | 250/307 |
| 4,837,435 | 6/1989 | Sakuhara et al. | 250/306 |
| 5,003,815 | 4/1991 | Martin et al. | 250/305 |

*Primary Examiner*—Jack I. Berman
*Assistant Examiner*—Kiet T. Nguyen
*Attorney, Agent, or Firm*—Antonelli, Terry, Stout & Kraus

[57] ABSTRACT

An apparatus of material surface observation related to the present invention is a scanning electron microscope which is combined with an accelerator of charged particles. The material surface is activated by irradiation of the charged particles and a surface reaction is induced. Secondary electron in generated by irradiation of the scanning electron beam depending on a shape of the material surface. The secondary electron generated by the irradiation of the scanning electron beam is discriminated from the secondary electrode generated by the irradiation of the charged particles, and only a signal of the secondary electron generated by the irradiation of the scanning electron beam is visualized. Consequently, a reaction process of the material surface which is activated or is reaction-induced by the irradiation of the charged particles can be observed in atomic level with less noise.

13 Claims, 5 Drawing Sheets

APPARATUS FOR MATERIAL SURFACE OBSERVATION

BACKGROUND OF THE INVENTION

The present invention relates to an apparatus for material surface observation, and especially to a scanning electron microscope preferable for observation in-situ an atomic level of a reaction at a material surface which is activated and induced by irradiation of a charged particle electromagnetic wave such as X-ray or synchrotron orbital radiation (SOR), an energetic beam such as a laser beam or an ion beam etc.

Currently, research on material characteristics of a solid surface has advanced rapidly owing to practical use of a scanning tunnel microscope (STM), etc., and to improvement in resolving power of a scanning electron microscope (SEM) reaching to several Å, which has made it possible to observe the solid surface such as a specific atomic configuration, etc., at an atomic level.

However, even though the conventional apparatus described above has made it possible to observe a stable surface condition before and after a reaction, observation of a transient reaction process has been impossible.

That is, as the conventional apparatus described above has not been provided with an apparatus to activate the surface of the sample during surface observation, the observation of the surface only after a reaction or the surface of a stable condition before the reaction has been possible, and measurement of an activated or a stable condition of the surface in the reaction process in the aspect of an atomic arrangement, or in-site observation of the reaction of a surface atom with an atmospheric atom (a surface reaction), etc. have been impossible.

An apparatus combining a transmission electron microscope with an ion accelerator for in-situ observation of a lattice defect generated in a sample by irradiation of ions has been disclosed in JP-A-62-31930 (1987).

Nevertheless, it is impossible to observe a reaction process at a solid surface in-situ even with the transmission electron microscope.

SUMMARY OF THE INVENTION

The object of the present invention is to provide an apparatus which makes it possible to activate a material surface and to observe a reaction process at the material surface in-situ with less noise which is caused by the activation of the material surface.

The object described above is achieved by observing the material surface under irradiation of charged particles by using a scanning electron microscope which is combined with an apparatus for activation of the material surface such as an accelerator of charged particles.

With the scanning electron microscope having jointly an accelerator of charged particles, the irradiated charged particles activate the material surface by changing atomic configuration and induce a surface reaction. A scanning electron beam generates secondary electrons of different number by the irradiation depending on shape of the material surface.

For observation of the material surface which is activated or reaction induced by irradiation of the charged particle with less noise in atomic level, a signal of secondary electron which is generated by irradiation of the scanning electron beam is discriminated from a signal of secondary electron which is generated by irradiation of the charged particles and only the signal of secondary electron which is generated by irradiation of the scanning electron beam is visualized.

In the present invention, the charged particle beam is irradiated to a sample intermittently as pulses, and the secondary electron generated at the sample is detected during a non-irradiation period of the charged particle beam in order to avoid influence of the secondary electron which is generated by the irradiation of the charged particle beam Otherwise, the surface of the sample is scanned intermittently with a pulse of the scanning electron beam concurrently with continuous irradiation of the charged particle beam, and a signal of the secondary electron during a non-irradiation period of the scanning electron beam is subtracted from a signal of the secondary electron generated from the sample during the irradiation period of the scanning electron beam for elimination of the effect of the secondary electron which is generated by the irradiation of the charged particle beam.

In case of combining an apparatus for generation of electromagnetic wave or an apparatus for generation of laser instead of the accelerator of charged particles, electromagnetic wave or laser beam acts the same as the charged particles.

Next, a theory of the present invention is explained.

In research of a surface characteristics of a solid having a wide industrial application, it is important to observe a reaction process at material surface for clarification of a process of an oxidizing reaction in aspect of a mutual reaction of an atom at solid surface with an atom in atmosphere, and for clarification of a problem of a joint in aspect of bonding strength of atoms on the solid surface.

Generally speaking, a reaction on a sample surface can be accelerated with changing of atmosphere in a sample room and of sample temperature. But, setting a reaction rate stable and suitable for the observation only by changing of temperature of the sample is generally difficult.

For instance, if a sample of iron group metal is heated to 500° C. in an oxidizing atmosphere, the surface of the sample is oxidized immediately. And the reaction rate is too fast to observe the process with a scanning electron microscope, etc. On the other hand, if a partial pressure of oxygen in the atmosphere is reduced and sample temperature is decreased, considerable decrease of the reaction rate is occurred and stop further proceeding of the reaction, and finally in-situ observation of the reaction becomes impossible. That means, there is a critical point which corresponds substantially to a starting point of the reaction in the partial pressure of oxygen and the sample temperature, and the reaction does not start substantially in a condition under the critical point, and on the other hand, the reaction proceeds too rapidly in a condition beyond the critical point.

FIG. 2 is a schematic drawing illustrating a state of energy to explain the reaction rate of the reaction described above, and the ordinate expresses a relative magnitude of energy. The height of the peak 11 shows an activation energy ($E_0$) necessary for the reaction, and adding external energy by such as heating to a sample staying at a position 12 before the reaction will initiate the reaction when the external energy reaches an level equal to the activation energy, that is, a critical point. And the reaction proceeds toward an energetically stable position 13 after the reaction. Providing $E_1$ for the energy at the position 13, the sample receives energy $E_0$ from outside and becomes stable by releasing $(E_0-E_1)$.

Therefore, once the reaction is initiated, the reaction proceeds very rapidly, and the reaction rate becomes faster as the $(E_0-E_1)$ described above is larger.

Generally, as the $(E_0-E_1)$ becomes larger in proportion to the $E_0$, it is necessary to lower the $E_0$ in order to proceed the reaction moderately. A catalyst is generally used. The sample is forced to be activated by the catalyst, and the activation energy is lowered. Therefore, the sample can be oxidized moderately with the catalyst without heating.

But in case of the scanning electron microscope, a catalyst which is usable without any contact to the sample in order not to disturb observation of the sample surface and has a low vapor pressure in order to maintain vacuum in the sample room is necessary.

One of the catalysts which fulfill the condition described above and are easy in handling is a charged particle. Exactly saying, the charged particle contacts with surface of the sample, but it does not disturb the observation of the sample surface and does not affect to the vacuum in the sample room. Handling of the charged particle is easy and the irradiation particle, energy of the irradiation, and the irradiation rate or the irradiation dose can be regulated readily, and consequently, it is possible to irradiate with a suitable condition for inducing a reaction. Accordingly, a moderate surface reaction induced by irradiation of the charged particle on surface of the sample can be observed by the scanning electron microscope.

Further, as a change and a reaction, etc., which are induced directly by irradiation of the charged particle on the surface of the solid sample can be observed in-situ, a reaction by mutual effects of an atom at the sample surface with an external atom, and a measurement of atomic configuration at activated surface of the sample, and moreover, a mutual reaction between the irradiated charged particle and an atom at the surface of the sample can be measured. That means a number of information on the reaction of solid surface can be obtained relatively easy.

DESCRIPTION OF PREFERABLE EMBODIMENTS OF THE INVENTION

Figure 1:
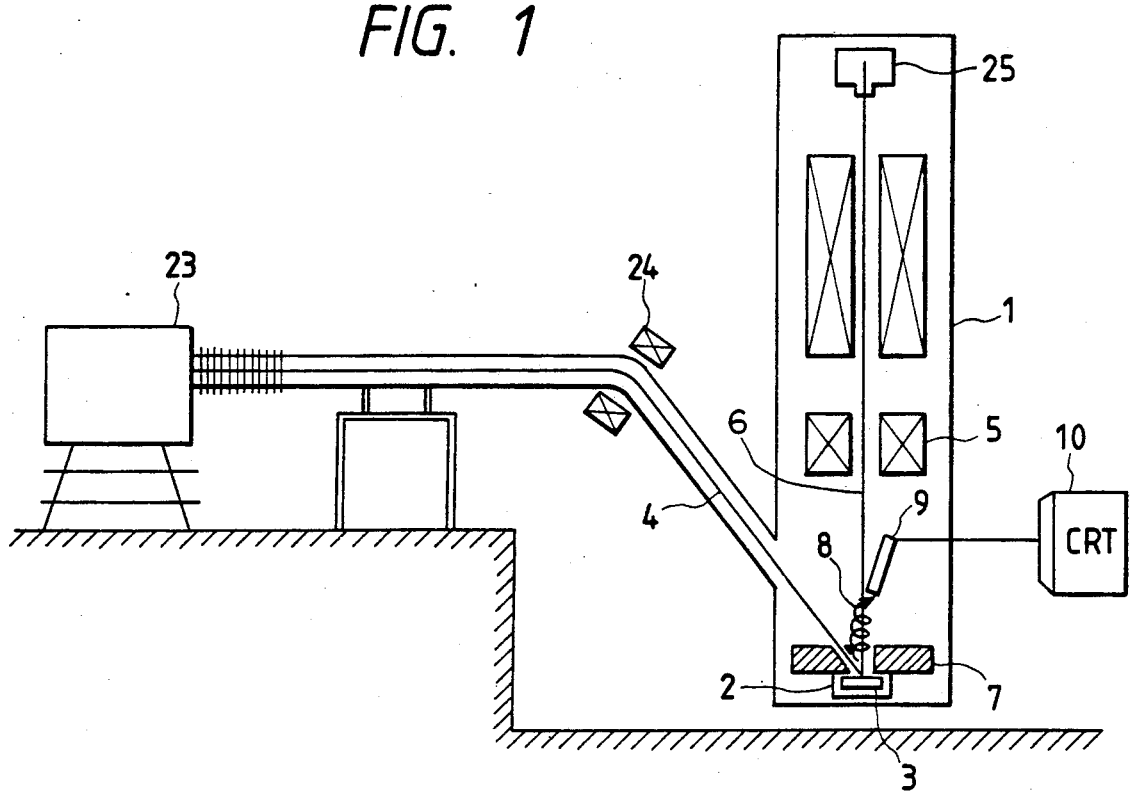
FIG. 1 is a schematic illustration showing a total composition of an apparatus for material surface observation relating to the present invention.
Figure 2:
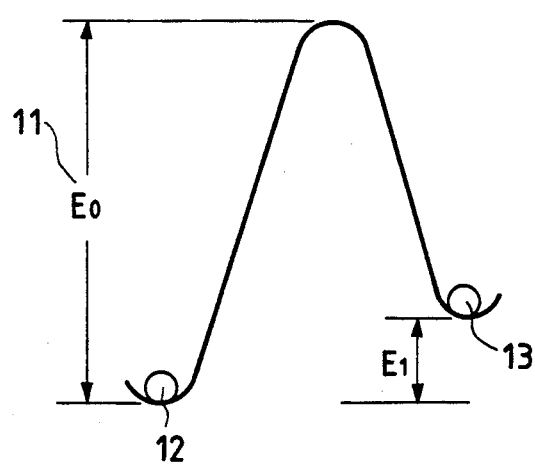
FIG. 2 is a schematic drawing to explain an energy state of a reaction caused by activation of the material.

FIG. 1 is a schematic illustration to show total composition of an apparatus for material surface observation of an embodiment of the present invention.

A sample 3 loaded in a sample room 2 which is installed in a container 1 is irradiated with a charged particle beam 4 and the surface of the sample 3 is activated. The charged particle beam 4 is generated at an ion accelerator 23, deflected by a deflecting electrode for the charged particle beam 24 and is irradiated to the sample 3 in the sample room 2. On the other hand, a scanning electron beam 6 from an electron gun 25 is regulated for scanning by a scanning electrode 5 and is irradiated to the sample 3. A secondary electron 8 which is generated by irradiation of the scanning electron beam 6 comes out through a collimator 7 and is detected by a secondary electron detector 9, and the detected strength is converted to an electric signal. The electric signal is used to visualize and to display the surface of the sample by an apparatus for display 10. By composing the apparatus for material surface observation in the way described above, a reaction can be easily induced at the surface of the sample.

By irradiation of the charged particle, the surface of the sample can be activated and the surface reaction can be induced, but the irradiation of the charged particle also generates secondary electron. Therefore, it is necessary to discriminate the signal of secondary electron generated by irradiation of the scanning electron beam from the signal of secondary electron generated by irradiation of the charged particle, and to visualize only the signal of secondary electron generated by irradiation of the scanning electron beam. Owing to the procedure described above, observation of the sample surface which is activated and induced a reaction by irradiation of the charged particles becomes possible in atomic level.

Figure 3:
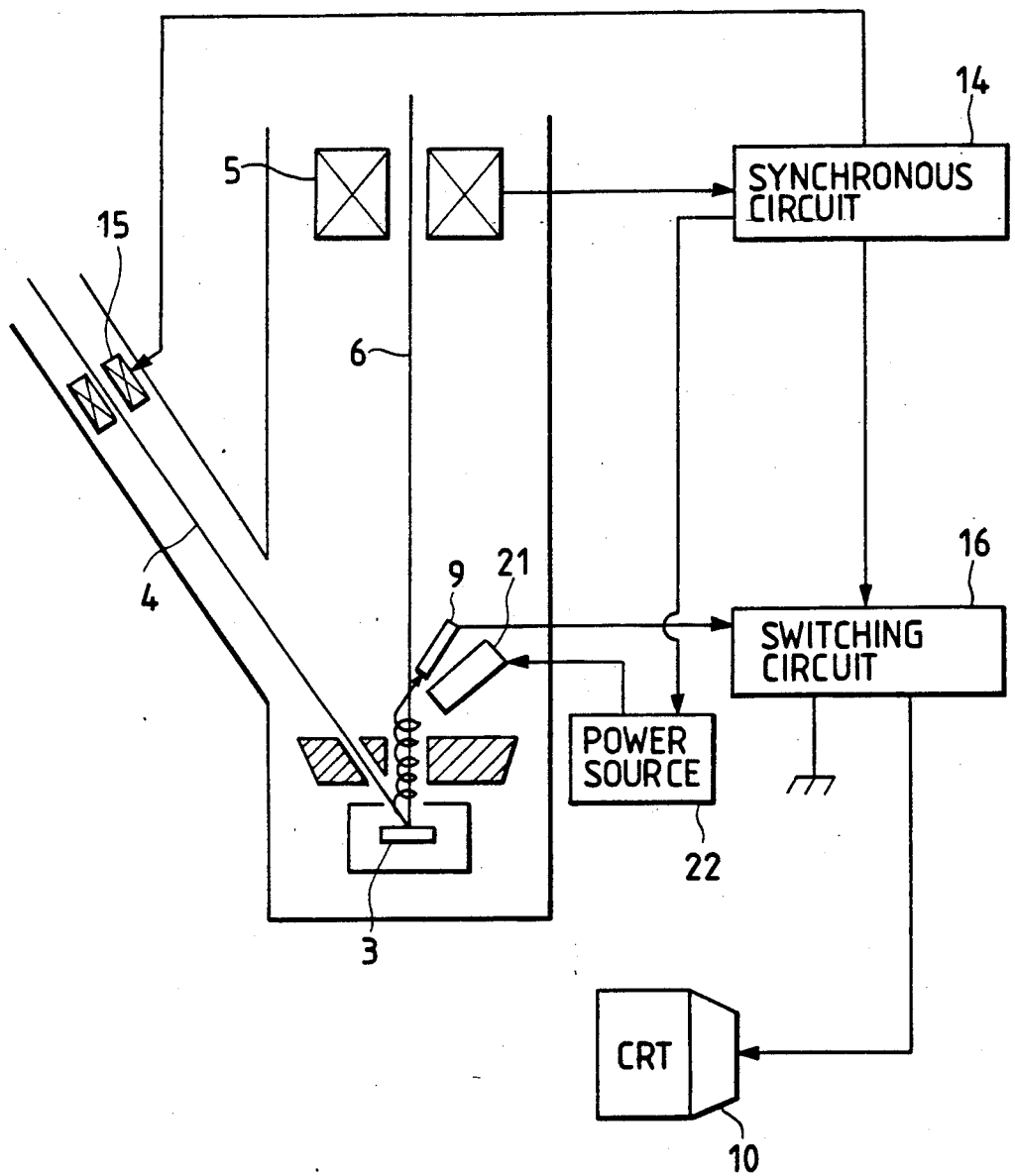
FIG. 3 is a schematic illustration showing the detail of the scanning electron microscope in the apparatus for material surface observation shown in FIG. 1.

The detail of an apparatus for material surface observation shown in FIG. 3 is illustrating an attachment of apparatus for processing the signal of the secondary electron in order to avoid influence of the secondary electron which is generated by irradiation of the charged particle.

In FIG. 3, the charged particle beam is pulsated and is irradiated to the sample intermittently in pulses and only the secondary electron which is generated by irradiation of the scanning electron beam is detected during the unirradiated period of the charged particle beam 4 in order to avoid influence of the secondary electron which is generated by irradiation of the charged particle. That is, by making the irradiation of the charged particle pulsated, only the electric signal of the secondary electron which is generated by irradiation of the scanning electron beam is transmitted to CRT 10.

Putting $\tau$ for a scanning cycle of the scanning electron beam 6 by a scanning electrode 5, a synchronous signal is transmitted to both of a charged particle beam deflector 15 and a switching circuit 16 with a cycle $(n.\tau)$ which is integer multiplication of $\tau$ by a synchronous circuit 14. The charged particle beam deflector is operated by the synchronous signal, and irradiates the sample with the charged particle beam as pulses having a cyclic period $\tau(n+m)$ with irradiation time $(n.\tau)$, and non-irradiation time $(m.\tau)$. On the other hand, a signal which is detected by the secondary electron detector 9 and converted to an electric signal is changed to a signal to the CRT 10 or a signal to ground by the switching circuit which is operated by the synchronous signal, and the signal of secondary electron is transmitted to the CRT only when the charged particle beam is not irradiated to the sample, and visualized.

But, at the moment after end of the time of the charged particle irradiation, as the secondary electron generated by the irradiation of the charged particles are still floating around the secondary electron detector, it is possible to transmit the signal of the secondary electron which is generated by the scanning electron irradiation to the CRT 10 only after a slight time delay from the end of irradiation time. As the secondary electron described above is disappeared only after several seconds to tens of seconds from the end of the irradiation (the time which is necessary to for the secondary electron to disappear after the end of the irradiation of charged particles is called "disappearing time of secondary electron" hereinafter), it is impossible to observe the surface of the sample with the SEM when the non-irradiation time of charged particle is shorter than the disappearing time of secondary electron. Therefore, by setting the non-irradiation time of charged particle (m.τ) longer than the disappearing time of secondary electron, it is possible to observe the sample surface after irradiation of the charged particle at a regular interval. But even in the case described above, it is only possible to observe the surface of the sample after several seconds or tens of seconds have passed from the end of the irradiation, and a possibility to observe the surface after it has been activated and the induced reaction has been completed is reasonably thought. Therefore, in the present embodiment, an apparatus, secondary electron elimination electrode 21, to eliminate the secondary electron which is floating around the secondary electron detector is provided.

As a means to eliminate the secondary electron, the secondary electron elimination electrode 21 is installed near the secondary electron detector and a constant positive voltage or negative voltage is applied during a constant time (s.τ) by a power source 22 in response to the signal from the synchronous circuit, and accordingly the secondary electron is eliminated. When a positive voltage is added, the electrode absorbs the secondary electron, and when a negative voltage is applied, the secondary electron is eliminated by repelling. By installing of the electrode, the disappearing time of secondary electron is shortened remarkably, and observation of the sample surface at the moment after the termination of the irradiation of the charged particle becomes possible.

Figure 4A:
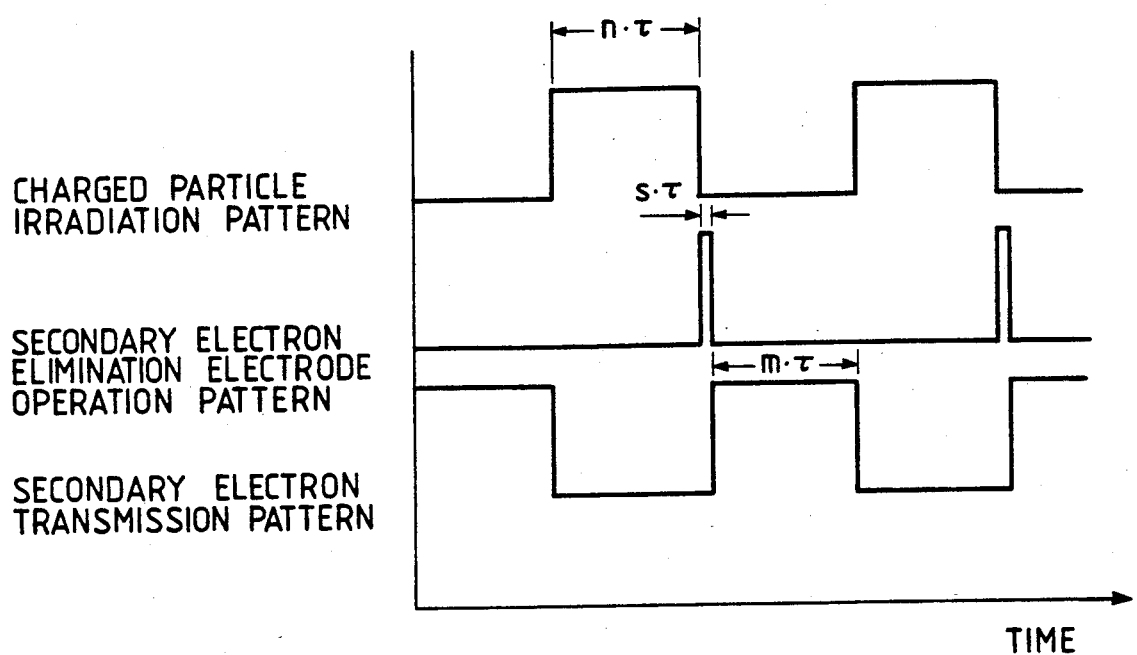
FIG. 4a is a drawing illustrating the charged particle irradiation pattern, secondary electron elimination electrode operation pattern, and secondary electron transmission pattern of the scanning electron microscope shown in FIG. 3.
Figure 4B:
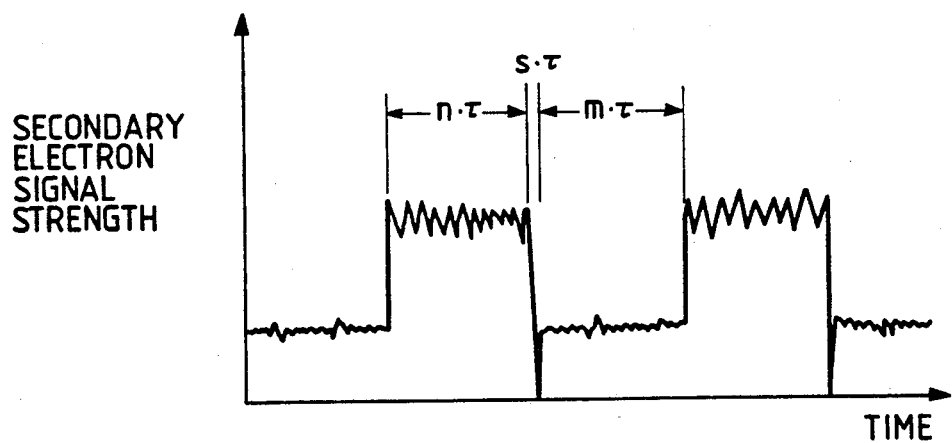
FIG. 4b is a drawing illustrating secondary electron signal strength which is detected by the scanning electron microscope shown in FIG. 3.

FIG. 4a is illustrating a charged particle irradiation pattern, a secondary electron elimination electrode operation pattern, and a secondary electron signal transmission pattern to CRT 10. FIG. 4b is illustrating time dependancy of the secondary electron signal in response to the patterns shown in FIG. 4a. The drawing reveals change of the secondary electron signal with regular cycles. That is, when a charged particle is irradiated to the sample, generation of the secondary electron by irradiation of the charged particle is remarkable and the strength of the signal is increased, but at the moment of termination of the irradiation, as the secondary electron elimination electrode starts operation and the detected secondary electron is decreased rapidly, and finally the signal is lowered to zero. Although the time that the signal is lowered to zero (disappearing time of the secondary electron) is changed depending on the condition of irradiation of the charged particle and voltage applied to the secondary electron elimination electrode, there is no problem if the disappearing time of the secondary electron under a certain condition is measured previously. After completion of voltage application to the secondary electron elimination electrode, the signal of the secondary electrode is transmitted to the CRT 10 and the image of the sample surface is visualized.

By using the apparatus described above, the surface of the sample which is irradiation by the charged particle for a time (n.τ) is able to be observed after a time (s.τ) has passed from the end of the irradiation for a time (m.τ) as a clear surface image without noise. By repeating the procedure described above, the surface of the sample which changes continuously can be observed almost continuously.

Figure 5:
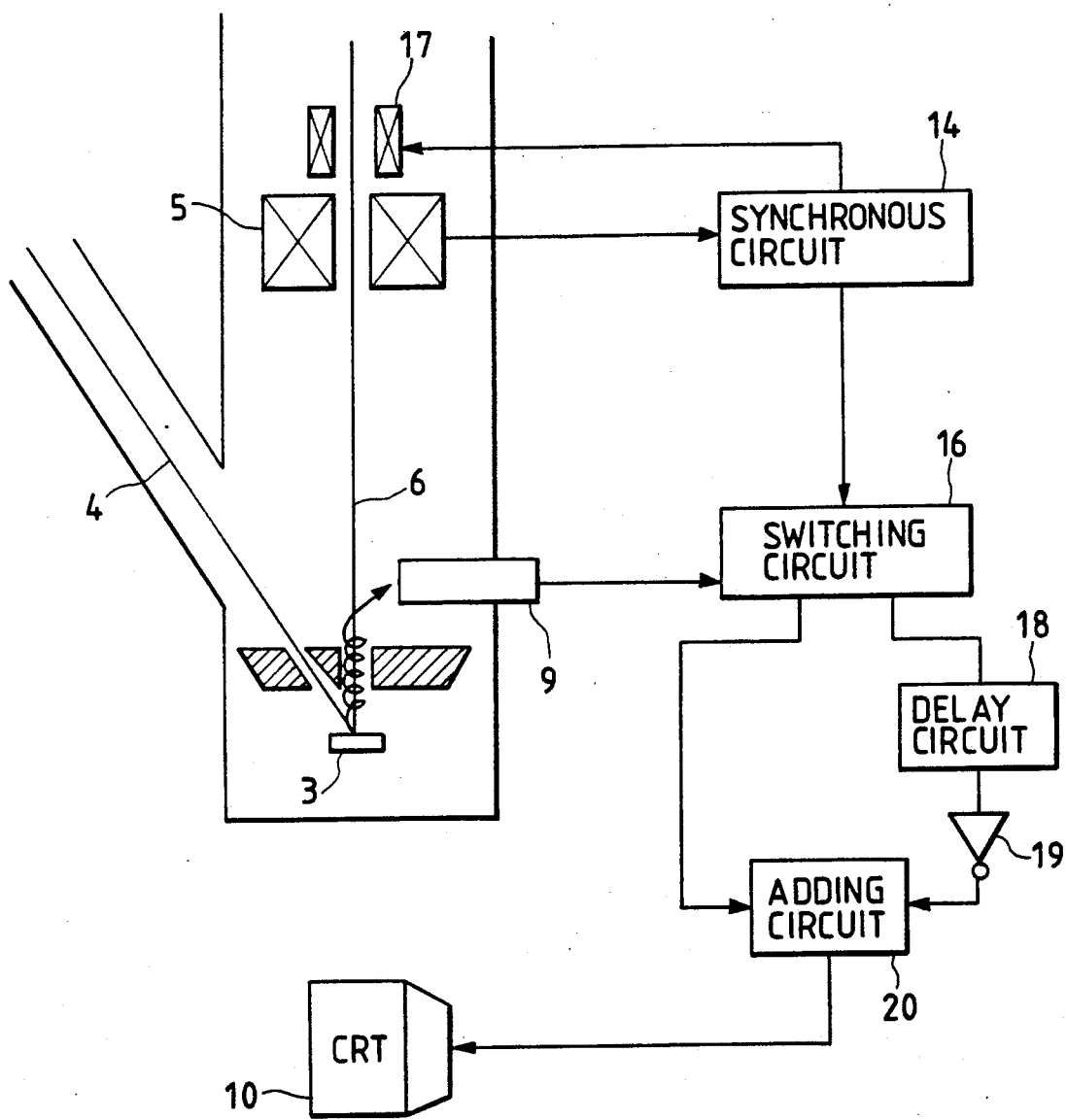
FIG. 5 is a schematic illustration showing the detail of the scanning electron microscope in the apparatus for material surface observation shown in FIG. 1.

FIG. 5 illustrating detail of an apparatus for material surface observation shows another embodiment wherein an apparatus to treat a signal of secondary electron is installed so as to avoid influence of the secondary electron which is generated by a charged particle beam.

The apparatus to treat a signal of secondary electron in the present embodiment is based on a means to transmit only the electric signal of the secondary electron which is generated by the irradiation of the scanning electron beam to the CRT by making the irradiation of the scanning electron beam pulsated. That is, concurrently with continuous irradiation of the charged particle, the sample is scanned with the pulsated scanning electron beam intermittently, and the signal strength of the secondary electron which is generated during a non-irradiation period of the scanning electron beam is subtracted from the signal strength of the secondary electron which is generated during an irradiation period of the scanning electron beam for elimination of the effect of the secondary electron which is generated by the charged particle beam.

Providing τ for a scanning cycle of the scanning electron beam 6 by a scanning electrode 5, a synchronous signal having the scanning cycle of τ multiplied by integer (2n.τ) is transmitted by a synchronous circuit 14 to a scanning electron beam deflector 17 and a switching circuit 16. The scanning electron beam deflector is operated with the synchronous signal, and the sample is irradiated with the pulsated scanning electron beam having a cycle (2n.τ) of an electron beam irradiation time (n,τ) and an equal a non-irradiation time of the scanning electron beam (n,τ). On the other hand, a signal which is detected by a secondary electron detector 9 and converted to an electric signal is divided by the switching circuit which is operated with the synchronous signal to a case to be transmitted to an adding circuit 20 through a delaying circuit 18 which delays the transmitting time of the signal and an inverter 19 and another case to be transmitted to the adding circuit directly with a cycle of 2 (n.τ).

Figure 6:
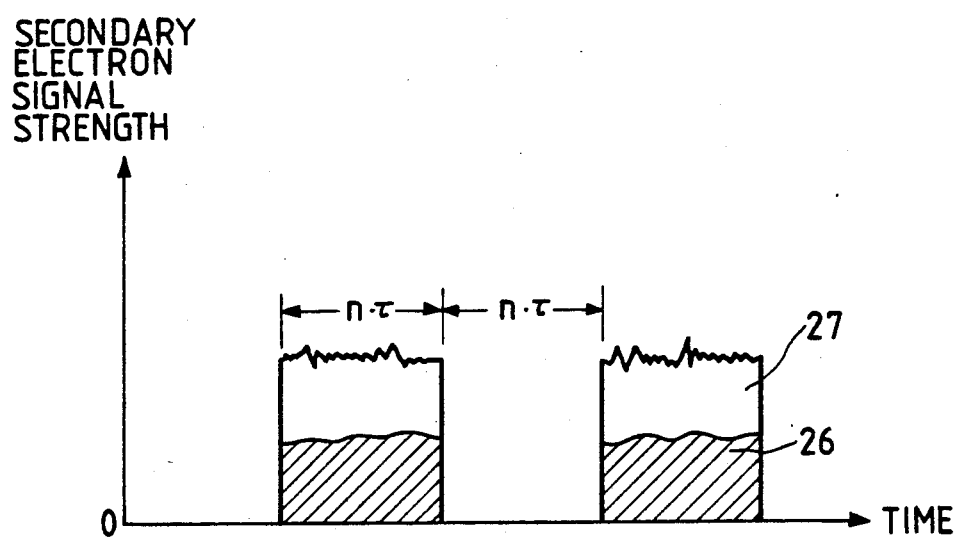
FIG. 6 is a drawing illustrating secondary electron signal strength which is detected by the scanning electron microscope shown in FIG. 5.

The switching circuit is set such that the secondary electron signal which is obtained during irradiation of the sample with the scanning electron beam is transmitted to the adding circuit directly, and another secondary electron signal which is obtained during only the irradiation of the sample with the charged particle beam is transmitted to the adding circuit through the delaying circuit. The time dependency of the signal which is transmitted to the adding circuit as described above is illustrated in FIG. 6. The signal detected in positive direction of signal strength is the sum of the secondary electron signal 27 which is generated by the irradiation of the scanning electron beam and the secondary electron signal 26 which is generated by the irradiation of the charged particle. On the other hand, the signal detected in negative direction of signal strength is only the signal which is generated by the irradiation of the charged particle. By addition of the signals at the adding circuit, the secondary electron signal which is generated by the irradiation of the charged particle is cancelled and only the secondary electron signal which is generated by the irradiation of the scanning electron beam can be transmitted to the CRT 10. Consequently, a clear image with less noise can be obtained.

The present invention is also applicable to scanning tunnel microscope (STM). The STM is a microscope which is able to observe surface of a solid in atomic level. Instead of a scanning electron microscope in an apparatus for material surface observation which are shown in FIGS. 3 and 5, the STM is used. That is, by combining the STM with an apparatus for charged particle generation, an atomic arrangement on surface of a sample which is activated by the irradiation of charged particle and a mutual reaction between atoms in a surface reaction can be observed.

An apparatus for material surface observation shown in FIG. 1 is using an ion accelerator as a means to activate surface of the sample, but an apparatus for generation of electromagnetic wave such as X-ray and SOR beam, etc., or an apparatus for generation of laser beam can be used. A surface reaction is induced by irradiation of electromagnetic wave such as X-ray and SOR beam or laser beam. Further, a surface change or a surface reaction induced directly by the irradiation of the electromagnetic wave or the laser beam can be observed in-situ.

Also, an apparatus for material surface observation of the present invention is able to be composed by combining an apparatus for ion injection with a scanning electron microscope.

When producing a semiconductor by an ion injection, if surface of a sample which is injected with ions can be observed, the ion injection can be performed while confirming that the surface has no contamination, no dust, and no flaw. The present embodiment is applicable not only to the manufacturing of the semiconductor, but also to reforming of a solid surface, and also in the case where an ion injection can be performed while confirming whether or not any of dust, contamination, flaw, precipitate, or grain boundary exist. Consequently, reliability of the products can be improved remarkably, and as the ion injection process can be observed in real time, it becomes possible to clarify a mechanism of the reforming by the ion injection. Further, it is possible to find out easily a condition to obtain a desired surface state.

By the present invention, the following effects can be achieved.

(1) A surface reaction of a sample can be induced optionally by irradiation of charged particle, etc., on the sample, and therefore, measurement of atomic arrangement of the surface when the sample surface is in an activated condition for the reaction and in-situ observation of the reaction of the solid surface become possible. Further, the surface change or reaction which are induced directly by the irradiation of charged particle, etc., can be observed in-situ. Consequently, it becomes possible to clarify the reaction mechanism at the solid surface and to resolve problems of surface oxidation and of a joint in a field of industrial application.

(2) Irradiation of charged particle and surface observation are possible without changing a sample holder, and therefore, a sample surface reacted under a certain condition can be observed without changing the condition (for instance, even though in a case of measuring temperature for effect and atmospheric effect by performing surface reaction under heating or cooling atmosphere, it is not necessary to transfer the sample from an apparatus for ion irradiation to a sample holder of a scanning electron microscope by taking out the sample into atmosphere, and as oxidation or other contamination of the sample surface by atmosphere during the transfer do not occur, the effects of temperature and atmosphere can be measured exactly). Also, the time (about 3~4 hours) which is necessary for changing the holder can be saved.

What is claimed is:

1. An apparatus for observing a surface of a material comprising:
   first irradiating means for irradiating a surface of a material with a first energy beam, the first energy beam causing the surface of the material to emit a first secondary energy beam;
   second irradiating means for irradiating the surface of the material with a second energy beam, the second energy beam causing the surface of the material to emit a second secondary energy beam; and
   image forming means for forming an image of the surface of the material in response to the first secondary energy beam, the image being substantially free of interference from the second secondary energy beam.

2. An apparatus according to claim 1, wherein the first energy beam is an electron beam, the first secondary energy beam is a first secondary electron beam, the second secondary energy beam is a second secondary electron beam, and the first irradiating means and the image forming means constitute a scanning electron microscope.

3. An apparatus according to claim 1, wherein the second energy beam is a charged particle beam, and the second irradiating means includes means for generating charged particles, and means for accelerating the charged particles to form the charged particle beam.

4. An apparatus according to claim 1, wherein the second energy beam is an X-ray beam.

5. An apparatus according to claim 1, wherein the second energy beam is a synchrotron orbital radiation (SOR) beam.

6. An apparatus according to claim 1, wherein the second energy beam is a laser beam.

7. An apparatus according to claim 1, wherein the second energy beam is an ion beam.

8. An apparatus according to claim 1, wherein the second energy beam is an electromagnetic energy beam.

9. An apparatus according to claim 1, wherein the image forming means includes:
   control means for controlling the second irradiating means to intermittently irradiate the surface of the material with the second energy beam;
   detecting means for detecting the first and second secondary energy beams and for producing an output signal representing the detected first and second secondary energy beams;
   switching means for receiving the output signal of the detecting means and for outputting the received output signal of the detecting means only during periods when the second irradiating means is not irradiating the surface of the material with the second energy beam; and display means for displaying an image of the surface of the material in response to the received output signal of the detecting means output by the switching means.

10. An apparatus according to claim 9, wherein the second secondary energy beam persists during the periods when the second irradiating means is not irradiating the surface of the material with the second energy beam, and wherein the image forming means further includes secondary energy beam eliminating means for eliminating the second secondary energy beam during the periods when the second irradiating means is not irradiating the surface of the material with the second energy beam.

11. An apparatus according to claim 1, wherein the image forming means includes:

control means for controlling the first irradiating means to intermittently irradiate the surface of the material with the first energy beam;

detecting means for detecting the first and second secondary energy beams and for producing an output signal representing the detected first and second secondary energy beams;

subtracting means for producing a subtraction output signal by subtracting an output signal of the detecting means produced during periods when the first irradiating means is not irradiating the surface of the material with the first energy beam from an output signal of the detecting means produced during periods when the first irradiating means is irradiating the surface of the material with the first energy beam; and display means for displaying an image of the surface of the material in response to the subtraction output signal produced by the subtracting means.

12. An apparatus according to claim 11, wherein the second irradiating means continuously irradiates the surface of the material with the second energy beam.

13. An apparatus according to claim 1, wherein the second energy beam has an energy effective for inducing one of a surface reaction in the material and a surface change in the material.

* * * * *